United States Patent
Sherrer

(10) Patent No.: US 7,026,697 B2
(45) Date of Patent: *Apr. 11, 2006

(54) MICROSTRUCTURES COMPRISING A DIELECTRIC LAYER AND A THIN CONDUCTIVE LAYER

(75) Inventor: David W. Sherrer, Blacksburg, VA (US)

(73) Assignee: Shipley Company, L.L.C., Marlborough, MA (US)

( * ) Notice: Subject to any disclaimer, the term of this patent is extended or adjusted under 35 U.S.C. 154(b) by 11 days.

This patent is subject to a terminal disclaimer.

(21) Appl. No.: 10/790,339

(22) Filed: Mar. 1, 2004

(65) Prior Publication Data

US 2004/0164423 A1    Aug. 26, 2004

Related U.S. Application Data

(63) Continuation-in-part of application No. 09/541,394, filed on Mar. 31, 2000, now Pat. No. 6,698,295.

(51) Int. Cl.
*H01L 29/84* (2006.01)

(52) U.S. Cl. ................. 257/415; 257/254

(58) Field of Classification Search ............... 257/415, 257/254
See application file for complete search history.

(56) References Cited

U.S. PATENT DOCUMENTS

| | | | |
|---|---|---|---|
| 4,649,630 A | 3/1987 | Boland et al. | |
| 4,853,669 A | 8/1989 | Guckel et al. | |
| 4,891,984 A | 1/1990 | Fujii et al. | |
| 4,922,756 A | 5/1990 | Henrion | |
| 4,996,082 A | 2/1991 | Guckel et al. | |
| 5,095,401 A | 3/1992 | Zavracky et al. | |
| 5,209,119 A | 5/1993 | Polla et al. | |
| 5,252,881 A | 10/1993 | Muller et al. | |
| 5,275,055 A | 1/1994 | Zook et al. | |
| 5,367,217 A | 11/1994 | Norling | |
| 5,417,115 A | 5/1995 | Burns | |
| 5,461,916 A | 10/1995 | Fujii et al. | |
| 5,475,318 A | 12/1995 | Marcus et al. | |
| 5,489,556 A | 2/1996 | Li et al. | |
| 5,537,083 A | 7/1996 | Lin et al. | |
| 5,594,166 A | 1/1997 | Itoh et al. | |
| 5,640,039 A | 6/1997 | Chau et al. | |
| 5,645,684 A | 7/1997 | Keller | |
| 5,658,698 A | 8/1997 | Yagi et al. | |
| 5,683,591 A | 11/1997 | Offenberg | |
| 5,772,322 A | 6/1998 | Burns et al. | |
| 5,796,152 A | 8/1998 | Carr et al. | |
| 5,808,210 A | 9/1998 | Herb et al. | |
| 5,808,331 A | 9/1998 | Zhang et al. | |
| 5,858,809 A | 1/1999 | Chau et al. | |
| 5,866,805 A | 2/1999 | Han et al. | |
| 5,870,007 A | 2/1999 | Carr et al. | |
| 5,883,310 A | 3/1999 | Ho et al. | |
| 5,922,212 A | 7/1999 | Kano et al. | |
| 5,936,159 A | 8/1999 | Kano et al. | |
| 5,943,155 A | 8/1999 | Goossen | |
| 5,959,376 A | 9/1999 | Allen | |

(Continued)

FOREIGN PATENT DOCUMENTS

WO    WO 2004/003981    1/2004

*Primary Examiner*—Tu-Tu Ho
(74) *Attorney, Agent, or Firm*—Jonathan D. Baskin

(57) ABSTRACT

Surface micromachined structures having a relatively thick dielectric layer and a relatively thin conductive layer bonded together.

20 Claims, 6 Drawing Sheets

U.S. PATENT DOCUMENTS

| | | |
|---|---|---|
| 5,973,394 A | 10/1999 | Slocum et al. |
| 5,987,989 A | 11/1999 | Yamamoto et al. |
| 6,012,336 A | 1/2000 | Eaton et al. |
| 6,090,665 A | 7/2000 | Kerber |
| 6,140,646 A * | 10/2000 | Busta et al. ............... 250/332 |
| 6,146,917 A | 11/2000 | Zhang et al. |
| 6,201,243 B1 * | 3/2001 | Jerominek ............... 250/338.1 |
| 6,238,935 B1 | 5/2001 | Egley et al. |

* cited by examiner

MICROSTRUCTURES COMPRISING A DIELECTRIC LAYER AND A THIN CONDUCTIVE LAYER

RELATED APPLICATIONS

This application is a continuation-in-part application of U.S. application Ser. No. 09/541,394, filed Mar. 31, 2000 now Pat. No. 6,698,295, the entire contents of which are incorporated herein by reference.

FIELD OF THE INVENTION

The present invention relates to micromachined structures. More specifically, the present invention relates to released, flexing, and/or suspended multilayer microstructures having a first layer of a structural dielectric material (e.g. silicon nitride) to provide structural support for the released/suspended layer and second layer of an electrically conductive material (e.g. doped polysilicon) disposed over the first layer.

BACKGROUND OF THE INVENTION

Released microstructures are commonly used in a variety of sensors, actuators and other useful devices. Released microstructures are suspended above a substrate (e.g. silicon) to which they are usually attached or anchored. Examples of released microstructures include comb drives, cantilevers, beams, membranes, switches, electrostatic motors and a wide variety of sensors (e.g. pressure sensors, magnetic sensors).

Released microstructures are often made from polysilicon. This is because polysilicon can be conformally deposited on many surfaces and it can be doped to provide conductivity. Also, polysilicon is easily released because there are a number of supporting materials available that can be selectively etched from under or surrounding a polysilicon layer (e.g. phosphosilicate glass, PSG). However, polysilicon has the great disadvantage that deposited polysilicon layers can have relatively high internal stress. Therefore, polysilicon structures tend to distort and bend when released. The tendency of polysilicon to bend after release is undesirable for making precision micromachined structures. Another disadvantage of polysilicon is that it can have a relatively low strength. In addition, polysilicon can have various states of crystallinity—ranging from relatively amorphous to having relatively large crystal grains. The size of these grains and their orientation effects the mechanical properties of the polysilicon layer. Even when polysilicon is deposited with the desired mechanical properties and grain size, the thermal budget in later processing may cause changes in these properties due to grain growth, precipitation at the grain boundaries, and other physical phenomena. For example, doped amorphous polysilicon may become significantly polysilicon during a LPCVD silicon nitride or PSG deposition that occurs after its deposition.

Polysilicon can be annealed to reduce internal stress and reduce bending. However, polysilicon annealing techniques are cumbersome and can interfere with other process steps required in making a useful device. It would be an improvement in the art to obviate polysilicon annealing in making certain released microstructures.

Due to these disadvantages of polysilicon, silicon nitride is sometimes used instead for released microstructures. Low stress silicon nitride films are readily formed without annealing by increasing the silicon content of the film. Also, silicon-rich silicon nitride is rigid, strong, and can be released from a variety of supporting layers. A problem with silicon nitride is that it is an electrical insulator, preventing the ability to charge and discharge the surface as is required in electrostatic actuators. Further, it can not be used alone to conduct a voltage or current as may be desired in electrical switching. For devices that require a thermally conductive released microstructure it may not be desirable or possible to use silicon nitride. Likewise, for devices in which high thermal conductivity is desirable, such as for heat dissipation, it may not be desirable or possible to use silicon nitride.

Therefore, there is a need in the art for an electrically conductive material that can form low internal stress, high strength micro structures. Such a material could be used in a wide variety of released microstructures. In addition, there is a need in certain applications for materials with high thermal conductivity.

U.S. Pat. No. 5,936,159 to Kano et al. discloses a released cantilever having a three-layer structure. The middle layer is a very thin stress relieving layer that tends to equalize stress in the cantilever, thereby reducing bending. In a preferred embodiment, a stress relieving layer tens of angstroms thick is disposed between thicker films of polysilicon.

U.S. Pat. No. 5,475,318 to Marcus et al. discloses a micromachined cantilever probe for contacting integrated circuits. The cantilever has two layers with different coefficients of expansion. When heated, the cantilever bends to provide electrical contact with a nearby electrical pad.

U.S. Pat. No. 5,866,805 to Han et al. discloses a cantilever having a magnetic thin film. The magnetic thin film provides magnetic coupling to a nearby electromagnet. The electromagnet can cause the cantilever to vibrate for use in 'AC mode' force microscopy. A second layer is applied to the cantilever to reduce bending of the cantilever.

U.S. Pat. No. 5,796,152 to Carr et al. discloses a cantilever having two separately bendable actuator sections. Each section can be heated separately. In is way, the cantilever can be caused to bend in complex shapes such as S-curves.

SUMMARY OF THE INVENTION

In a first aspect of the present invention, a micromachined apparatus is provided comprising a substrate and a released microstructure disposed on the substrate, the microstructure comprising a dielectric layer and a conductive polysilicon layer attached to the dielectric layer, wherein the polysilicon layer has a thickness less than ⅕ the dielectric layer thickness. In a second aspect of the present invention, a micromachined apparatus is provided comprising a substrate and a released microstructure disposed on the substrate, the microstructure comprising a dielectric layer and a conductive layer attached to the dielectric layer, wherein the conductive layer has a thickness less than ⅕ the dielectric layer thickness.

BRIEF DESCRIPTION OF THE DRAWINGS

The foregoing summary and the following detailed description of the preferred embodiments of the present invention will be best understood when read in conjunction with the appended drawings, in which.

DETAILED DESCRIPTION OF THE INVENTION

The present invention provides released microstructures having a dielectric layer, such as silicon nitride or silicon carbide, combined with a much thinner layer (e.g., 1/5, 1/10, 1/50 or 1/100 the thickness of the dielectric layer) of a conductive material, such as a metal or polysilicon. The thin conductive layer can be located on the top side and/or bottom side of the dielectric layer, or within the dielectric layer. The relatively thick dielectric layer provides good mechanical properties for the microstructure (e.g., high strength, low internal stress, high rigidity). The conductive layer is sufficiently thin so that it does not adversely affect the mechanical properties of the microstructure. The thin conductive layer provides electrical conductivity so that the microstructure can be used in electrostatic actuators, piezoresistive devices and other microelectromechanical systems (MEMS), or micro-electro-opto-mechanical devices. Preferably, the conductive layer is highly conductive (e.g., if polysilicon, heavily doped) so that it can be exceptionally thin (e.g., less than 25 nanometers) and still provide good surface conductivity. For example, the dielectric layer thickness may desirably be in the range of about 2–50 microns and the conductive layer thickness in the range of 5–50 nanometers. Alternatively, the dielectric layer thickness and conductive layer thickness may be 2–50 microns and 1–1000 nanometers, respectively, or 3–50 microns and 1–100 nanometers, respectively, or 5–50 microns and 5–50 nanometers, respectively, for example. Of course, the required conductivity and thickness of the conductive layer depend upon the microstructure design and its application.

Figure 1:
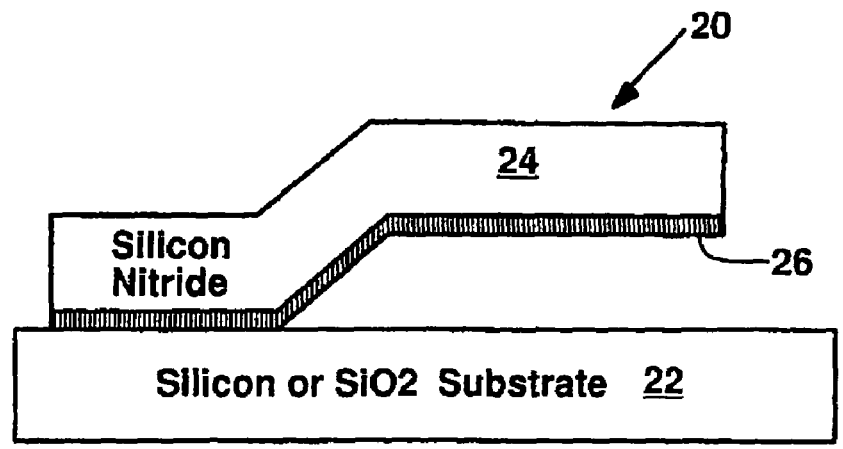
FIG. 1 shows a cantilever according to the present invention.

FIG. 1 shows a simple cantilever 20 according to the present invention. The cantilever 20 is attached to a substrate 22 made of silicon or silica, for example (other substrates can also be used). The cantilever comprises a relatively thick dielectric layer 24, and a relatively thin conductive layer 26 on a bottom side of the cantilever. The dielectric layer 24 and the conductive layer 26 are bonded together, and both can be formed using low pressure chemical vapor deposition (LPCVD) or plasma-enhanced chemical vapor deposition. The conductive layer 26 is thin enough relative to the dielectric layer 24 such that the mechanical properties (e.g., strength, internal stress, rigidity) of the cantilever are primarily determined by the dielectric layer. The electrical conductivity of the cantilever is primarily determined by the conductive layer 26.

According to the present invention, the conductive layer 26 may desirably have a thickness less than 1/5 the thickness of the dielectric layer 24. Preferably, the conductive layer-thickness is less than 1/10, 1/20, 1/30, 1/50, or 1/100 the dielectric layer thickness. Thin conductive layers are preferred, because they have a small effect on the mechanical properties of the cantilever or microstructure. In addition, materials for the dielectric layer may desirably be chosen which have a thermal conductivity of at least 50 Watts per meter Kelvin.

If polysilicon is used in the conductive layer 26, the polysilicon may preferably have a dopant concentration greater than about $10^{17}$ per cubic centimeter, more preferably, greater than $10^{18}$ or $10^{20}$ atoms per cubic centimeter. Polysilicon can be doped with phosphorous, boron, or any other dopant that imparts conductivity. Preferably, the polysilicon is doped with a material that can be incorporated during LPCVD or PECVD deposition (e.g., phosphorous). The dopant level in polysilicon can have a wide range of values. The dopant level should be high enough to provide adequate surface conductivity necessary for the intended use of the microstructure (e.g., electrostatic actuation, piezoresistive sensing, switching or electrostatic charge dissipation). In many microelectromechanical applications, surface conductivity (Ohms per square) of the conductive layer is the important consideration.

Figure 2:
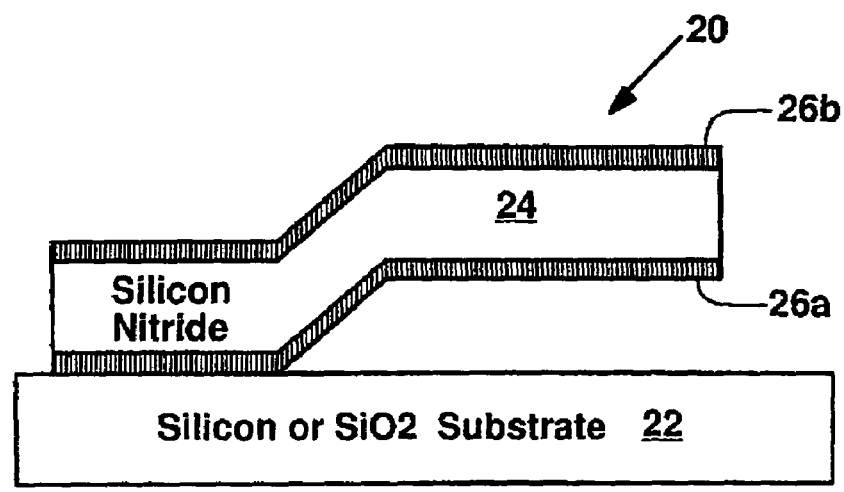
FIG. 2 shows an alternative embodiment having both top and bottom conductive layers.

FIG. 2 shows an alternative embodiment of the present invention where the cantilever 20 has a first conductive layer 26a and a second conductive layer 26b. The dielectric layer 24 is sandwiched between the conductive layers 26a, 26b. Each conductive layer has a thickness less than 1/5 the thickness of the dielectric layer. More preferably, each conductive layer is less than 1/10 or 1/20 the thickness of the dielectric layer. Preferably, the thicknesses of the conductive layers 26a, 26b are equal. The conductive layers 26a, 26b are thin enough so that the mechanical properties of the cantilever are primarily determined by the dielectric layer 24. A benefit of this structure is that the stresses in the conductive layer can counterbalance each other producing a near net zero stress effect on the structural layer to prevent deflection. Alternatively, the thickness of the layers can be made of two different thicknesses to impart a net stress force on the structural layer. This could be useful to establish a state of curl or static deflection in a cantilever.

Figure 3:
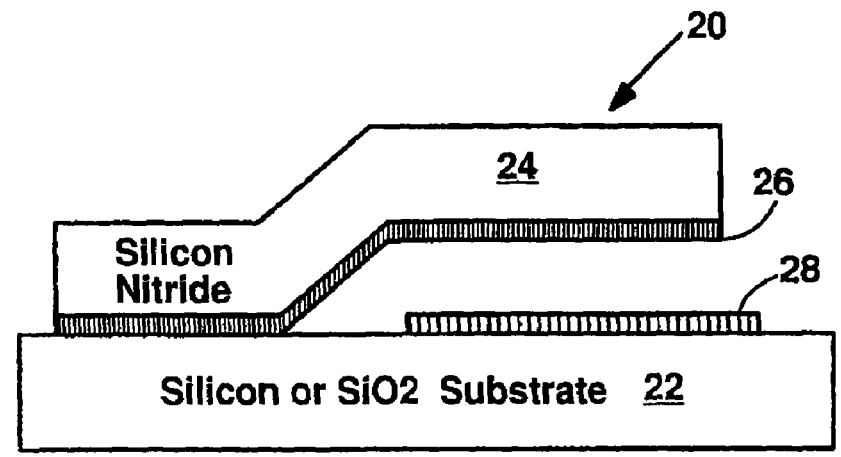
FIG. 3 shows a cantilever and a conductive pad for electrostatic actuation of the cantilever.

FIG. 3 shows a cantilever device of the present invention in operation. A conductive pad 28 disposed on the substrate 22 is electrostatically coupled to the conductive layer 26. Applying a voltage between the conductive pad 28 and the conductive layer 26 causes the cantilever to move with respect to the substrate 22. The conductive layer 26 also assures that electrostatic charges in the dielectric layer 24 are rapidly dissipated. As noted, the mechanical properties of the cantilever are primarily determined by the dielectric layer 24.

Figure 4:
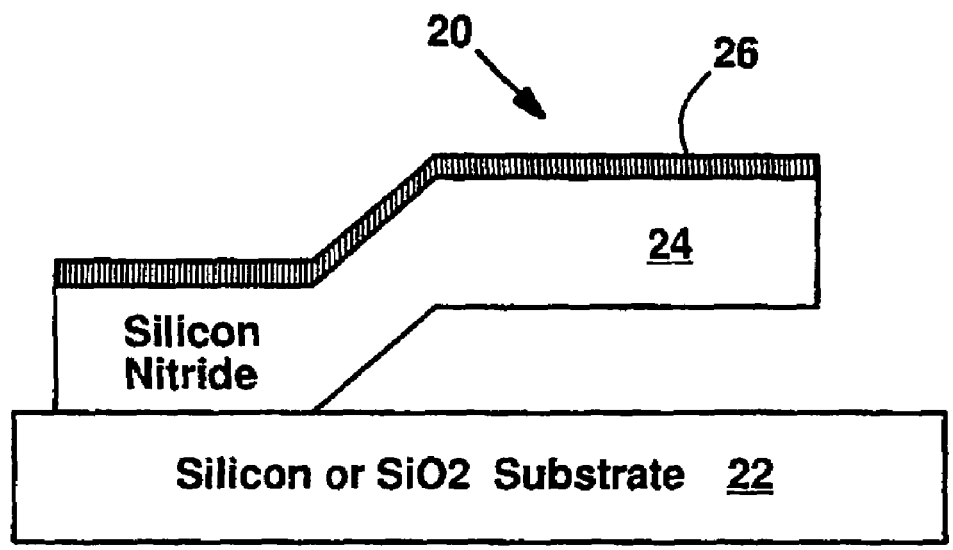
FIG. 4 shows a cantilever with a conductive layer on the top surface.

FIG. 4 shows another embodiment of the present invention where the conductive layer 26 is disposed on top of the dielectric layer 24. The dielectric layer 24 may desirably comprise silicon rich (SiN) low stress dielectric. Other stoichiometries can also be used. Preferably, the internal stress in the dielectric layers is in the range of −300 to +300 MPa. More preferably, the dielectric layer often has an internal tensile stress in the range of 20–300 MPa tensile stress.

FIGS. 5a–5e illustrate a preferred method for making the microstructures of the present invention. First, in FIG. 5a, phosphosilicate glass (PSG) 30 is deposited and patterned on a substrate 22 (e.g., a silicon or quartz substrate). There are many well known processes for depositing and patterning PSG.

Figure 5A:
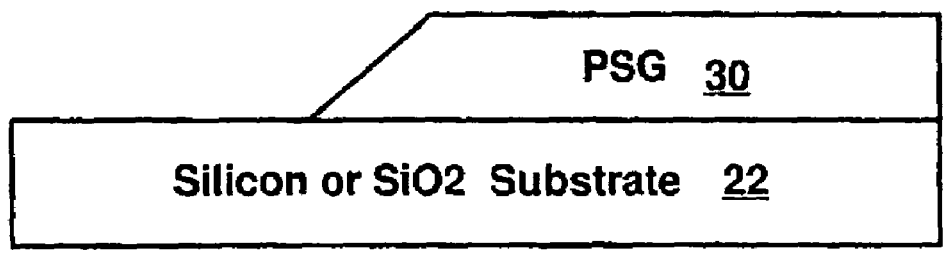
FIGS. 5a–5e illustrate a preferred method for making the present invention.
Figure 5B:
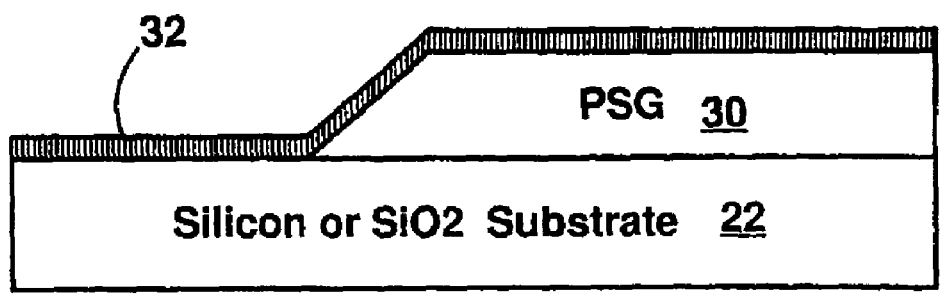

Next, in FIG. 5b, conductive material is deposited conformally on the PSG 30. Preferably, the conductive layer 32 is deposited by low-pressure chemical vapor deposition, and if polysilicon is used it may be doped as it is deposited. For example, the polysilicon can be doped with phosphorous by flowing phosphene ($PH_3$) in the CVD furnace during polysilicon deposition.

Figure 5C:
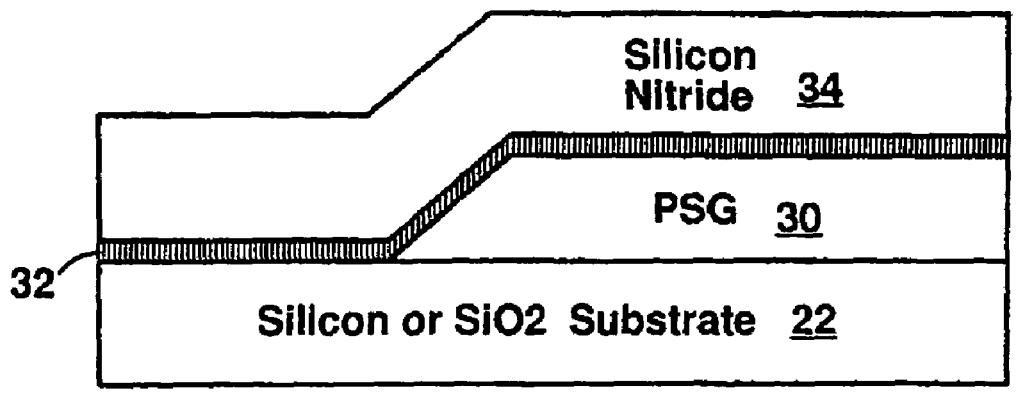

Next, in FIG. 5c, a dielectric layer 34 is deposited on top of the conductive layer 32. Preferably, the dielectric layer 34 is deposited using LPCVD. Preferably, the conductive layer 32 and the dielectric layer 34 are deposited in the same LPCVD step. During deposition, gas flow is changed from silane/phosphene (for doped polysi) to silane/ammonia for a silicon nitride dielectric. Alternatively, the gas flow can be changed relatively slowly so that a compositional transition region is formed between the conductive layer 32 and dielectric layer 34. In this case, the transition region will have an intermediate composition between dielectric and conductor.

Figure 5D:
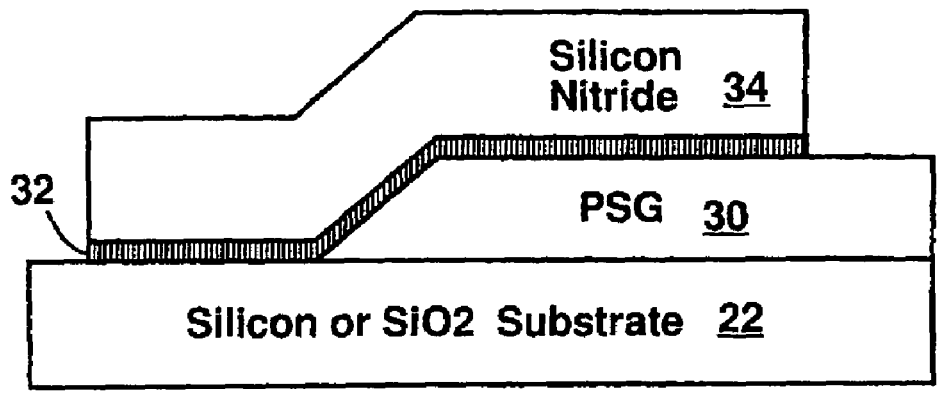

Next, in FIG. 5d, photoresist (not shown) is deposited and patterned, and reactive ion etching is used to remove dielectric and conductive material from selected areas. This step exposes the PSG 30.

Figure 5E:
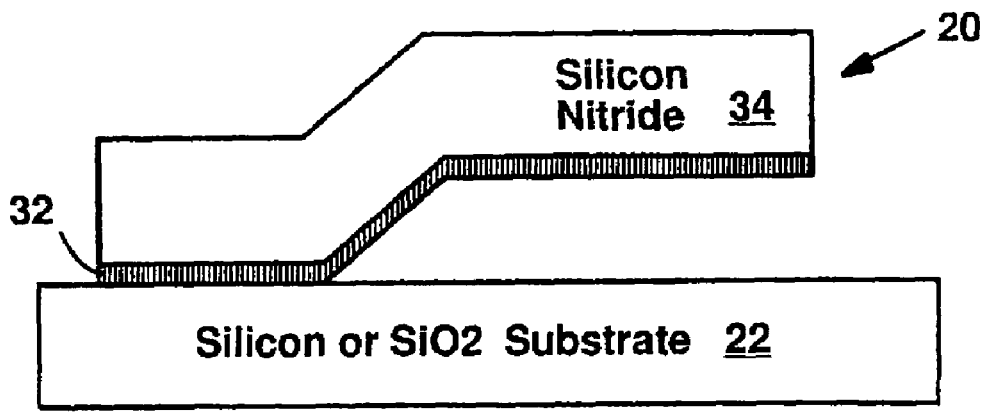

Finally, in FIG. 5e, the PSG 30 is removed in a release step. This can be performed in a fluorine-containing plasma, or using wet-etching techniques. A freestanding, released cantilever is provided after the release step.

Figure 6:
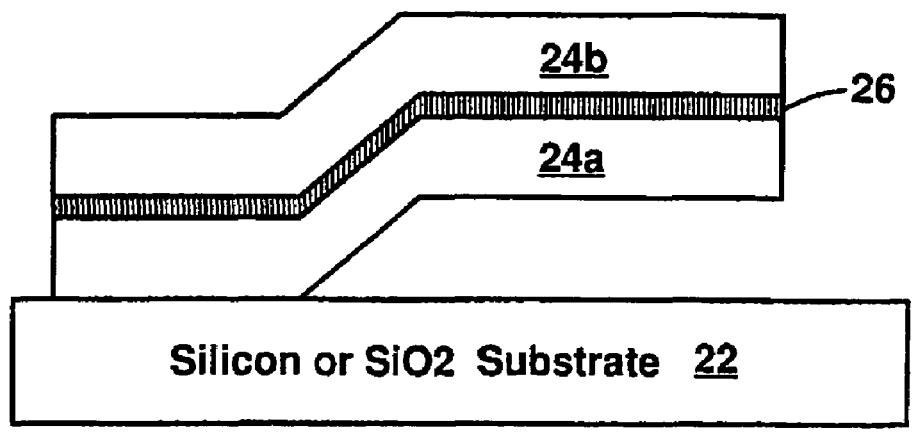
FIG. 6 shows an alternative embodiment with a conductive layer disposed within the dielectric layer.

FIG. 6 shows an alternative embodiment of the present invention where the conductive layer 26 is disposed within the dielectric layer (dividing it into two 'sublayers' 24a, 24b). This structure can be easily made by first depositing dielectric, followed by conductive material, and then more dielectric. All the layers can be deposited in the same LPCVD step by adjusting gas composition. In this embodiment, the aggregate thickness of the two sublayers 24a, 24b should be at least 5 times the thickness of the conductive layer. More preferably, the aggregate thickness of the dielectric sublayers 24a, 24b are 10, 20, 50, or 100 times as thick as the conductive layer 26. Also preferably, the sublayers 24a, 24b have approximately equal thickness. Also, multiple conductive layers may be disposed within the dielectric layer.

Figure 7:
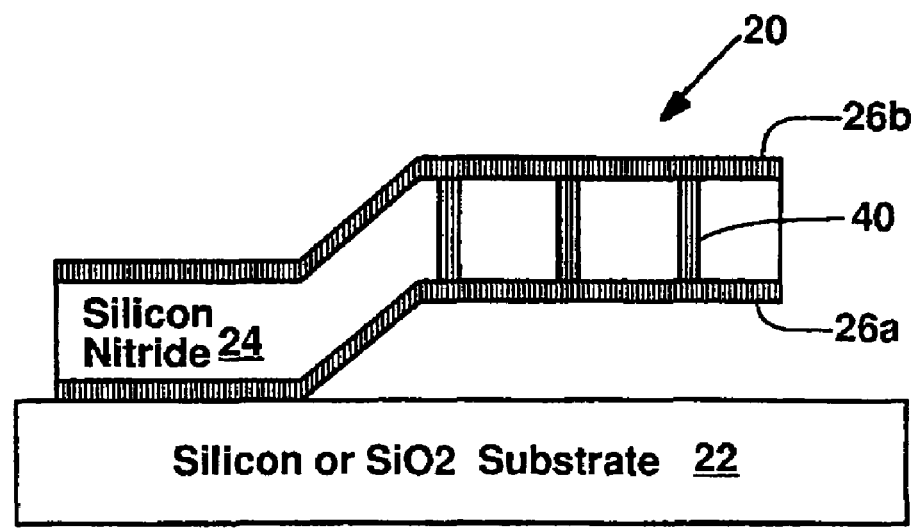
FIG. 7 shows an alternative embodiment of the present invention having vias for electrically connecting top and bottom conductive layers.

FIG. 7 shows yet another embodiment of the present invention having top and bottom conductive layers 26a, 26b that are electrically coupled by via holes 40 through the dielectric layer 24. The vias can be made by reactive ion etching through the dielectric 24 before the deposition of the top conductive layer 26b. Conductive material, such as polysilicon, within the via holes 40 provides electrical connection between the top and bottom surfaces.

Figure 8:
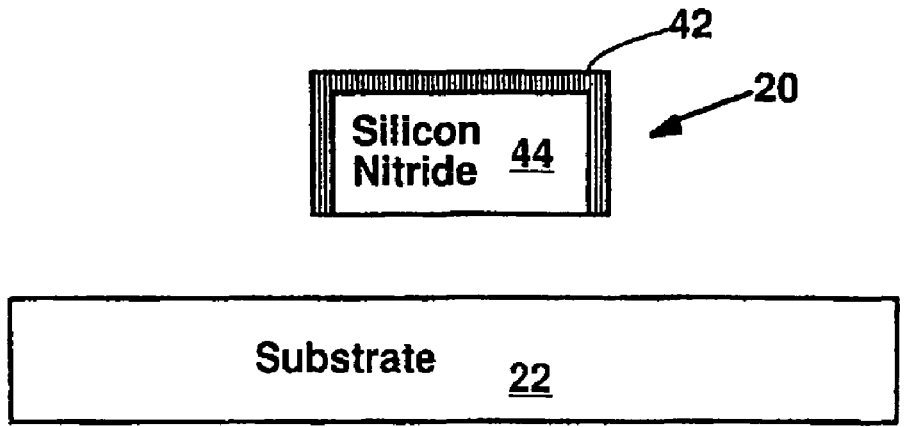
FIG. 8 shows a cross sectional view of a cantilever of the present invention having a conductive layer on the top surface and sidewalls.

FIG. 8 shows yet another embodiment of the present invention where a thin, conductive layer 42 is conformally deposited on a dielectric 44 after the dielectric layer is etched. The view of FIG. 8 is a cross-sectional view perpendicular to the length of the cantilever 20. In this embodiment, the conductive layer 42 covers the top surface and sidewalls of the dielectric 44.

Figure 9A:
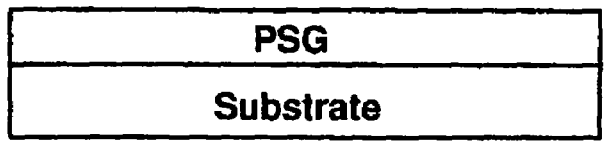
FIGS. 9a–9f illustrate a method for making the cantilever shown in FIG. 8.
Figure 9B:
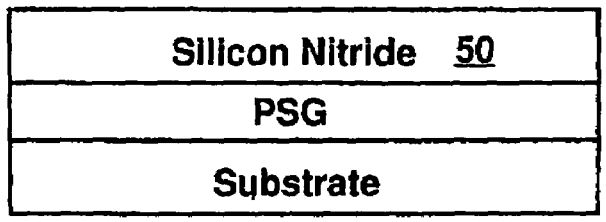
Figure 9C:
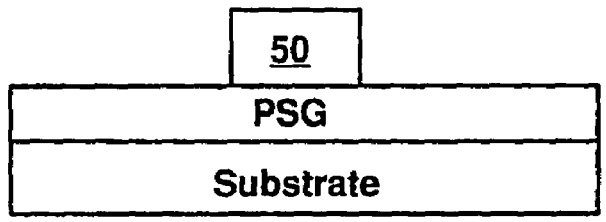
Figure 9D:
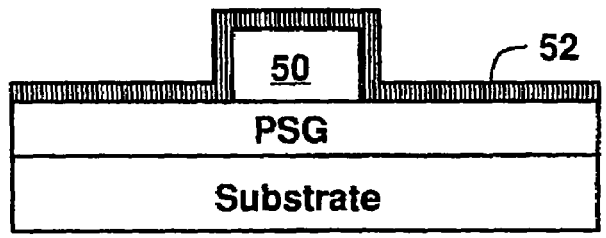
Figure 9E:
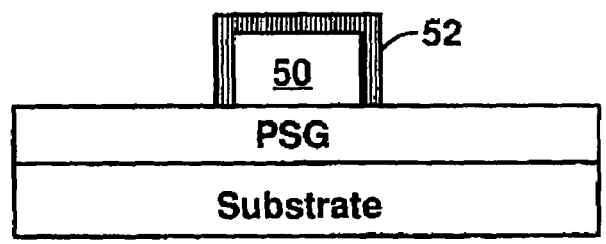
Figure 9F:
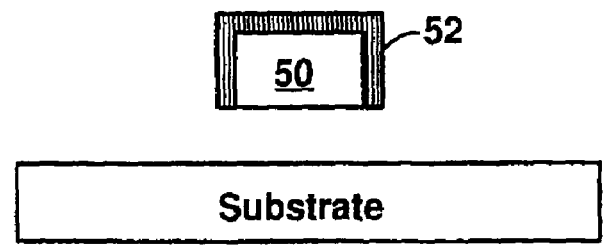

FIGS. 9a–9f illustrate a preferred method for making the cantilever shown in FIG. 8. First, in FIG. 9a, PSG is deposited and patterned on a substrate. Next, a dielectric layer 50 is deposited on the PSG using LPCVD. In FIG. 9c, the dielectric layer 50 is etched using reactive ion etching. Alternatively, vias are also etched in the dielectric layer during this step. Next, in FIG. 9d, a conductive layer 52 is conformally deposited using LPCVD. Next, in FIG. 9e, the conductive layer is etched from the PSG using resist patterning and then reactive ion etching or other etching techniques. Finally, in FIG. 9f, the PSG is removed, releasing the cantilever. In this embodiment, the conductive layer thickness should be less than ⅕ of a width of the dielectric.

Figure 10A:
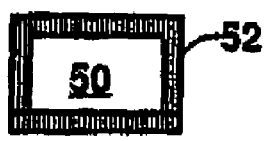
FIGS. 10a–10b shows an embodiment of the present invention where the dielectric layer is enclosed with conductive polysilicon.
Figure 10B:
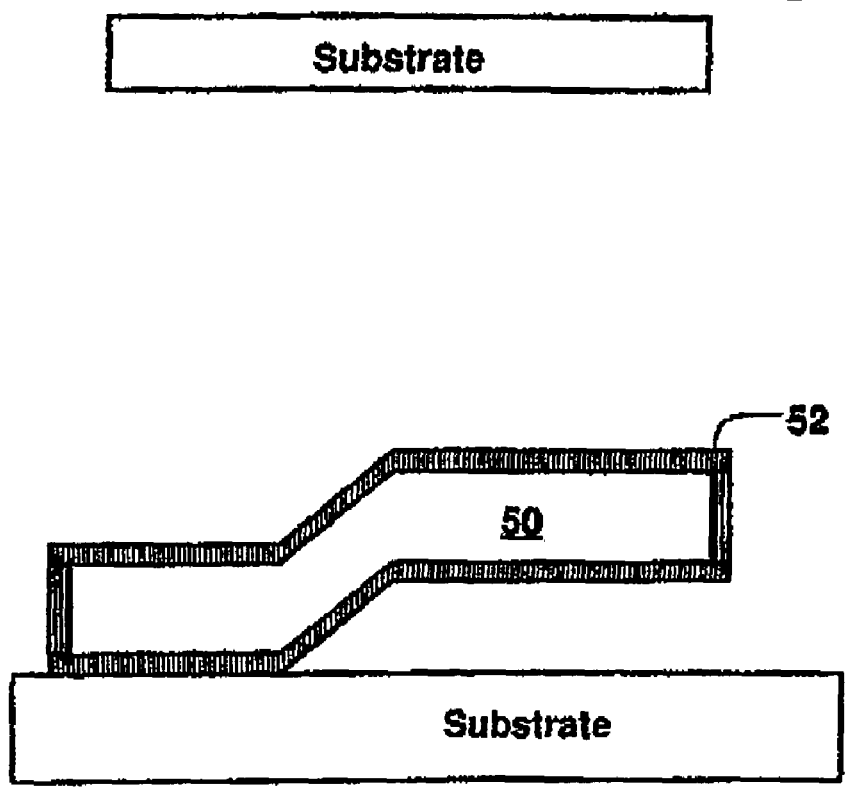

Alternatively, a conductive layer is deposited before the dielectric layer 50 is deposited so that the cantilever 20 is completely enclosed by conductive polysilicon. FIG. 10a–10b shows a cross sectional view of a cantilever completely enclosed by polysilicon.

Figure 11:
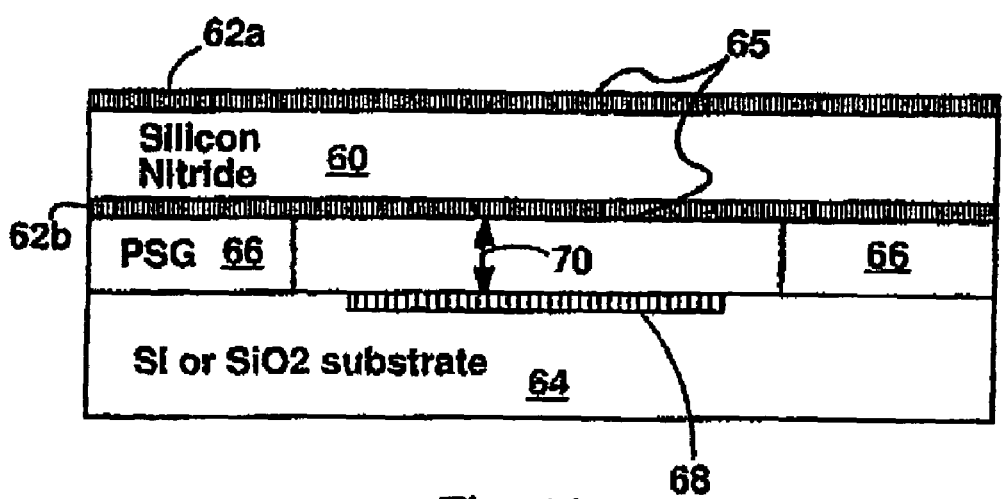
FIG. 11 shows a particularly useful application of the present invention for a microelectrooptomechanical variable reflector.

FIG. 11 shows a particularly useful application of the present invention. A dielectric layer 60 and conductive layers 62a, 62b are suspended above a substrate 64 by PSG 66 or similar material. The dielectric layer and conductive layers comprise a diaphragm 65. Conductive pad 68 is disposed below the diaphragm 65. The conductive pad can be a doped region of a silicon substrate, for example. Applying a voltage between the conductive layers 62a, 62b and the conductive pad moves the diaphragm up or down, changing a gap distance 70.

In a particularly useful application of the present invention, thicknesses of the dielectric layer 60 and conductive layers 62a–b are selected so that the diaphragm 65 has a ¼ wavelength thickness for a certain optical wavelength. This allows the device to be used as an electrostatically controlled variable optical reflector. The gap distance 70 may be changed to modulate the transmission or reflection of light of a given wavelength. The conductive layers provide for rapid electrostatic charge dissipation so that the device can operate at high frequency. It is preferable for the diaphragm to have top and bottom conductive layers as shown, but the diaphragm can optionally have a single top or bottom conductive layer. Clearly, such conductive layers could be patterned along the structural material allowing, for example, optical properties and electrical properties to be separated.

It is noted that the boundary between the conductive layer and the dielectric layer may not be well-defined. This is particularly true in embodiments where gas composition is changed relatively slowly during CVD deposition. In this case, the boundary between the dielectric layer and conductive layer (for purposes of determining layer thicknesses) is defined as where the silicon/nitrogen ratio is ½.

It will be appreciated by those skilled in the art of surface micromachining that many other more complex structures can be made according to the present invention. For example, electrostatic motors, switches, comb drives and other devices comprising dielectric with an attached conductive layer can fall within the scope of the present invention. In such devices, the polysilicon can provide the conductivity necessary for operation.

It is also noted that the microstructures of the present invention are not necessarily released by wet etching PSG, or other release materials. Microstructures according to the present invention can be released by bulk micromachining (e.g. anisotropic wet etching, isotropic wet etching, or isotropic dry etching) of the substrate material.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A micromachined apparatus comprising:
   a substrate; and
   a released microstructure disposed on the substrate, comprising:
      a dielectric layer, and
      a conductive polysilicon layer attached to the dielectric layer, wherein the polysilicon layer has a thickness less than ⅕ the dielectric layer thickness.

2. The apparatus of claim 1 wherein the polysilicon layer contacts and covers the dielectric layer.

3. The apparatus of claim 1 wherein the polysilicon layer is enclosed within the dielectric layer.

4. The apparatus of claim 1 comprising an additional polysilicon layer attached to the dielectric layer, and wherein the dielectric layer is sandwiched between the polysilicon layers.

5. The apparatus of claim 4 wherein the polysilicon layers have equal thickness.

6. The apparatus of claim 1 wherein the dielectric layer comprises a via hole.

7. The apparatus of claim 1 wherein the microstructure comprises a cantilever that is attached to the substrate.

8. The apparatus of claim 1 wherein the microstructure comprises a switch.

9. The apparatus of claim 1 comprising a conductive pad disposed on the substrate and electrostatically coupled to the polysilicon layer, and wherein the microstructure is capable of being deflected by an electrostatic force applied to the polysilicon layer.

10. The apparatus of claim 1 wherein the dielectric layer comprises silicon carbide.

11. A micromachined apparatus comprising:
    a substrate; and
    a released microstructure disposed on the substrate, comprising:
       a dielectric layer, and
       a conductive layer attached to the dielectric layer, wherein the conductive layer has a thickness less than ⅕ the dielectric layer thickness, and wherein the conductive layer is disposed between the substrate and the dielectric layer,
    wherein the released microstructure is electrically deflectable with respect to the substrate.

12. The apparatus of claim 11 wherein the conductive layer contacts and covers the dielectric layer.

13. A micromachined apparatus comprising:
    a substrate; and
    a released microstructure disposed on the substrate, comprising:
       a dielectric layer, and
       a conductive layer attached to the dielectric layer, wherein the conductive layer has a thickness less than ⅕ the dielectric layer thickness, and wherein the conductive layer is enclosed within the dielectric layer,
    wherein the released microstructure is electrically deflectable with respect to the substrate.

14. A micromachined apparatus comprising:
    a substrate; and
    a released microstructure disposed on the substrate, comprising:
       a dielectric layer,
       a first conductive layer attached to the dielectric layer, wherein the conductive layer has a thickness less than ⅕ the dielectric layer thickness, and
       a second conductive layer attached to the dielectric layer, and wherein the dielectric layer is sandwiched between the conductive layers,
    wherein the released microstructure is electrically deflectable with respect to the substrate.

15. The apparatus of claim 14 wherein the first and second conductive layers have equal thickness.

16. A micromachined apparatus comprising:
    a substrate; and
    a released microstructure disposed on the substrate, comprising:
       a dielectric layer comprising a via hole, and
       a conductive layer attached to the dielectric layer, wherein the conductive layer has a thickness less than ⅕ the dielectric layer thickness,
    wherein the released microstructure is electrically deflectable with respect to the substrate.

17. The apparatus of claim 11 wherein the microstructure comprises a cantilever that is attached to the substrate.

18. The apparatus of claim 11 wherein the microstructure comprises a switch.

19. The apparatus of claim 11 wherein the dielectric layer comprises silicon carbide.

20. A micromachined apparatus comprising:
    a substrate; and
    a released microstructure disposed on the substrate, comprising:
       a silicon carbide dielectric layer, and
       a conductive layer attached to the dielectric layer, wherein the conductive layer has a thickness less than ⅕ the dielectric layer thickness, and wherein the conductive layer is disposed between the substrate and the dielectric layer,
    wherein the released microstructure is electrically deflectable with respect to the substrate.

* * * * *